United States Patent
Tsai et al.

(10) Patent No.: US 10,851,453 B2
(45) Date of Patent: Dec. 1, 2020

(54) METHODS AND APPARATUS FOR SHUTTER DISK ASSEMBLY DETECTION

(71) Applicant: APPLIED MATERIALS, INC., Santa Clara, CA (US)

(72) Inventors: Cheng-Hsiung Tsai, Cupertino, CA (US); Ananthkrishna Jupudi, Singapore (SG); Eiji Asahina, Chiba (JP); Sarath Babu, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 213 days.

(21) Appl. No.: 15/950,726

(22) Filed: Apr. 11, 2018

(65) Prior Publication Data

US 2019/0316251 A1 Oct. 17, 2019

(51) Int. Cl.
| | |
|---|---|
| *C23C 14/52* | (2006.01) |
| *C23C 14/02* | (2006.01) |
| *C23C 14/54* | (2006.01) |
| *C23C 14/56* | (2006.01) |
| *H01J 37/34* | (2006.01) |

(52) U.S. Cl.
CPC ........... *C23C 14/52* (2013.01); *C23C 14/021* (2013.01); *C23C 14/54* (2013.01); *C23C 14/564* (2013.01); *H01J 37/3447* (2013.01)

(58) Field of Classification Search
CPC ............................. C23C 14/52; H01J 37/3447
See application file for complete search history.

(56) References Cited

U.S. PATENT DOCUMENTS

| | | | |
|---|---|---|---|
| 5,980,194 A | * | 11/1999 | Freerks ............. H01L 21/67259 414/754 |
| 6,051,113 A | | 4/2000 | Moslehi |
| 6,669,829 B2 | | 12/2003 | Feltsman et al. |
| 9,147,558 B2 | | 9/2015 | Chia et al. |
| 9,564,348 B2 | | 2/2017 | Lavitsky et al. |
| 2003/0155234 A1 | * | 8/2003 | Feltsman ............... C23C 14/566 204/298.11 |
| 2008/0276867 A1 | | 11/2008 | Schaller |
| 2009/0182454 A1 | | 7/2009 | Donoso et al. |
| 2010/0089315 A1 | | 4/2010 | Brown et al. |
| 2012/0103793 A1 | | 5/2012 | Fuji |
| 2012/0325140 A1 | | 12/2012 | Schaller |
| 2014/0271081 A1 | | 9/2014 | Lavitsky et al. |
| 2015/0202774 A1 | | 7/2015 | Blank et al. |
| 2017/0326733 A1 | | 11/2017 | Ramachandran et al. |

FOREIGN PATENT DOCUMENTS

CN 103276352 A 9/1918

OTHER PUBLICATIONS

International Search Report for PCT/US2019/026243 dated Jul. 25, 2019.

* cited by examiner

*Primary Examiner* — John J Brayton
(74) *Attorney, Agent, or Firm* — Moser Taboada (57) ABSTRACT

Methods and apparatus for detecting a shutter disk assembly in a process chamber using a number of sensors. A first, second, and third sensor in a shutter housing for a shutter disk assembly provide indications of a status of the shutter disk assembly. The indications are used in part to determine the operational status of the shutter disk assembly along with process information from a process controller. The operational status is then used to alter a process of the process chamber when necessary.

20 Claims, 6 Drawing Sheets

METHODS AND APPARATUS FOR SHUTTER DISK ASSEMBLY DETECTION

FIELD

Embodiments of the present principles generally relate to semiconductor manufacturing processes.

BACKGROUND

Semiconductors are formed in process chambers which have the capability to process substrates (e.g., semiconductor wafers) in a controlled processing environment. In order to maintain process uniformity and ensure optimal performance of the process chamber, various conditioning operations are periodically completed within the process chambers. In one such operation, a physical vapor deposition (PVD) process chamber is conditioned using a "burn-in" process where a target disposed in the PVD process chamber is bombarded with plasma ions to remove oxides or other contaminants from the target prior to performing substrate processes. A pasting process may also be used in a PVD process chamber to condition the chamber by depositing material on process chamber surfaces to prevent material from flaking off the process chamber surfaces and contaminating the substrate during subsequent processes. Typically, substrates are subjected to a cleaning process prior to being placed in the PVD chamber. The cleaning process is referred to as "pre-cleaning" and performed in a pre-clean process chamber. The pre-cleaning removes any chemical residue or oxides which may be formed when the wafer is exposed to the atmosphere.

In the conditioning and pre-cleaning operations, a shutter disk may be positioned via a blade or shutter arm onto a substrate support disposed in the process chamber to prevent the deposition of any materials on the substrate support. The shutter disks are often stored clear of the processing area in a shutter housing or shutter garage and moved by the shutter arm into a desired position during use. If the shutter disk and shutter arm are not moved clear of the substrate support, a catastrophic failure of the process chamber can occur when the substrate support is moved into a processing position.

Thus, the inventors have provided improved methods and apparatus for detection of a shutter disk assembly in a semiconductor process chamber.

SUMMARY

Methods and apparatus provide detection of a shutter disk assembly in semiconductor process chambers.

In some embodiments, a method of detecting a shutter disk assembly in a process chamber comprises receiving first sensor detection information from a first sensor located in a shutter housing of the process chamber, the first sensor positioned to detect a shutter arm, receiving second sensor detection information from a second sensor located in the shutter housing of the process chamber, the second sensor positioned to detect a shutter disk, receiving third sensor detection information from a third sensor located in the shutter housing of the process chamber, the third sensor positioned to detect the shutter disk, receiving process information from a process controller, determining an operational status of the shutter disk assembly based, at least in part, on at least one of the first sensor detection information, the second sensor detection information, the third sensor detection information, and the process information, and altering at least one process of the process chamber, if necessary, based on the operational status of the shutter disk assembly.

In some embodiments, the method further includes altering at least one process of the process chamber by performing a calibration of the shutter disk assembly; altering at least one process of the process chamber by re-positioning the shutter arm; altering at least one process of the process chamber by halting the process and setting an alarm; wherein the operational status of the shutter disk assembly includes, at least, an angle from a shaft sensor of a shaft of the shutter arm; determining if the shutter disk assembly exceeds a duration of time during an idle period and altering at least one process of the process chamber by halting the process and setting an alarm; determining the operational status to not be in error when the first sensor detection information indicates blockage, the second sensor detection information indicates no blockage, the third sensor detection information indicates blockage, and the process information indicates shutter disk assembly stored; determining the operational status to be in error when the first sensor detection information indicates blockage, the second sensor detection information indicates blockage, the third sensor detection information indicates no blockage, and the process information indicates shutter disk assembly stored; determining the operational status to be in error when the first sensor detection information indicates no blockage, the second sensor detection information indicates blockage, the third sensor detection information indicates no blockage, and the process information indicates shutter disk assembly stored; determining the operational status to not be in error when the first sensor detection information indicates blockage, the second sensor detection information indicates blockage, the third sensor detection information indicates no blockage, and the process information indicates shutter disk assembly stored; determining the operational status to be in error when the first sensor detection information indicates blockage, the second sensor detection information indicates blockage, the third sensor detection information indicates no blockage or blockage, and the process information indicates shutter arm stored; determining the operational status to not be in error when the first sensor detection information indicates blockage, the second sensor detection information indicates no blockage, the third sensor detection information indicates no blockage, and the process information indicates shutter arm stored; and/or determining the operational status to be in error when the first sensor detection information indicates no blockage, the second sensor detection information indicates no blockage, the third sensor detection information indicates blockage, and the process information indicates shutter disk assembly idle timed out.

In some embodiments, a method of detecting a shutter disk assembly in a process chamber comprises storing the shutter disk assembly in a shutter housing appended to the process chamber, receiving first sensor detection information from a first sensor located in a shutter housing of the process chamber, the first sensor positioned to detect a shutter arm, setting a first sensor detection level based on the first sensor detection information, the first sensor detection level indicating that a shutter disk arm is correctly stored; receiving second sensor detection information from a second sensor located in the shutter housing of the process chamber, the second sensor positioned to detect a shutter disk; setting a second sensor detection level based on the second sensor detection information, the second sensor detection level indicating that a shutter disk is correctly stored; receiving third sensor detection information from a third sensor located in the shutter housing of the process chamber, the third sensor positioned to detect the shutter disk; setting a third sensor detection level based on the third sensor detection information, the third sensor detection level indicating that the shutter disk is correctly stored; storing the first sensor detection level, the second sensor detection level, and the third sensor detection level; and retrieving the first sensor detection level, the second sensor detection level, or the third sensor detection level during a process to determine an operational status of the shutter disk assembly.

In some embodiments, the method further includes comparing the first sensor detection level, the second sensor detection level, or the third sensor detection level to current sensor detection information of the first sensor, the second sensor, or the third sensor to determine a status of the shutter disk assembly; receiving process information from a process controller and determining an operational status of the shutter disk assembly based on current sensor detection information and, at least in part, on at least one of the first sensor detection level, the second sensor detection level, the third sensor detection level, and the process information; altering the first sensor detection level, the second sensor detection level, or the third sensor detection level to account for heat expansion or contraction of the shutter disk assembly during a process; and/or altering the first sensor detection level, the second sensor detection level, or the third sensor detection level to account for deposition of material on the shutter disk assembly during a process.

In some embodiments, an apparatus for detecting a shutter disk assembly for a process chamber comprises a shutter housing appended to the process chamber, a first sensor attached to the shutter housing such that the first sensor is capable of detecting a shutter arm when the shutter arm is in the shutter housing, a second sensor attached to the shutter housing such that the second sensor is capable of detecting a shutter disk when the shutter disk is in the shutter housing, a third sensor attached to the shutter housing such that the third sensor is capable of detecting the shutter disk when the shutter disk is in the shutter housing, and a process controller that interacts with the first sensor, second sensor, and the third sensor to detect fault conditions of the shutter disk assembly during a process by using a method of detecting the shutter disk assembly in a process chamber comprising receiving first sensor detection information from a first sensor located in a shutter housing of the process chamber, the first sensor positioned to detect a shutter arm; receiving second sensor detection information from a second sensor located in the shutter housing of the process chamber, the second sensor positioned to detect a shutter disk; receiving third sensor detection information from a third sensor located in the shutter housing of the process chamber, the third sensor positioned to detect the shutter disk; receiving process information from a process controller; and determining an operational status of the shutter disk assembly based, at least in part, on at least one of the first sensor detection information, the second sensor detection information, the third sensor detection information, and the process information.

In some embodiments, the apparatus further comprising wherein the process chamber is a pre-clean chamber or a physical vapor deposition (PVD) chamber.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide an enhanced shutter disk assembly detection with a larger range of motion window. Sensor positioning in the shutter housing allows mechanical placement tuning and process tuning to prevent unwanted false alarms. The sensor configurations also allow for more flexibility in sensor detection levels, placement, and maintenance. Larger movement detection windows further reduce false alarms by allowing compensation for changes during a process such as heat expansion/contraction and/or dimensional changes due to deposition build-up. The sensors are also easier to clean and easier to replace. Another advantage is the flexibility to activate individual sensors separately making troubleshooting and calibration easier. The methods and apparatus also advantageously provide a process controller the ability to allow automated fixes depending on the severity of a detected fault condition. If an automated adjustment can clear the fault condition, the operator's attention is not needed and production can continue quickly without requiring further downtime and manual repairs, saving time and money. For example, a first time calibration or a re-calibration can be automatically performed by the process controller. Repositioning of a shutter arm can also be done automatically to clear certain faults without direct operator interaction. Under some conditions, the methods and apparatus may enable faster notification to the operator of adverse conditions by halting a process and/or setting an alarm before damage can occur.

Figure 1:
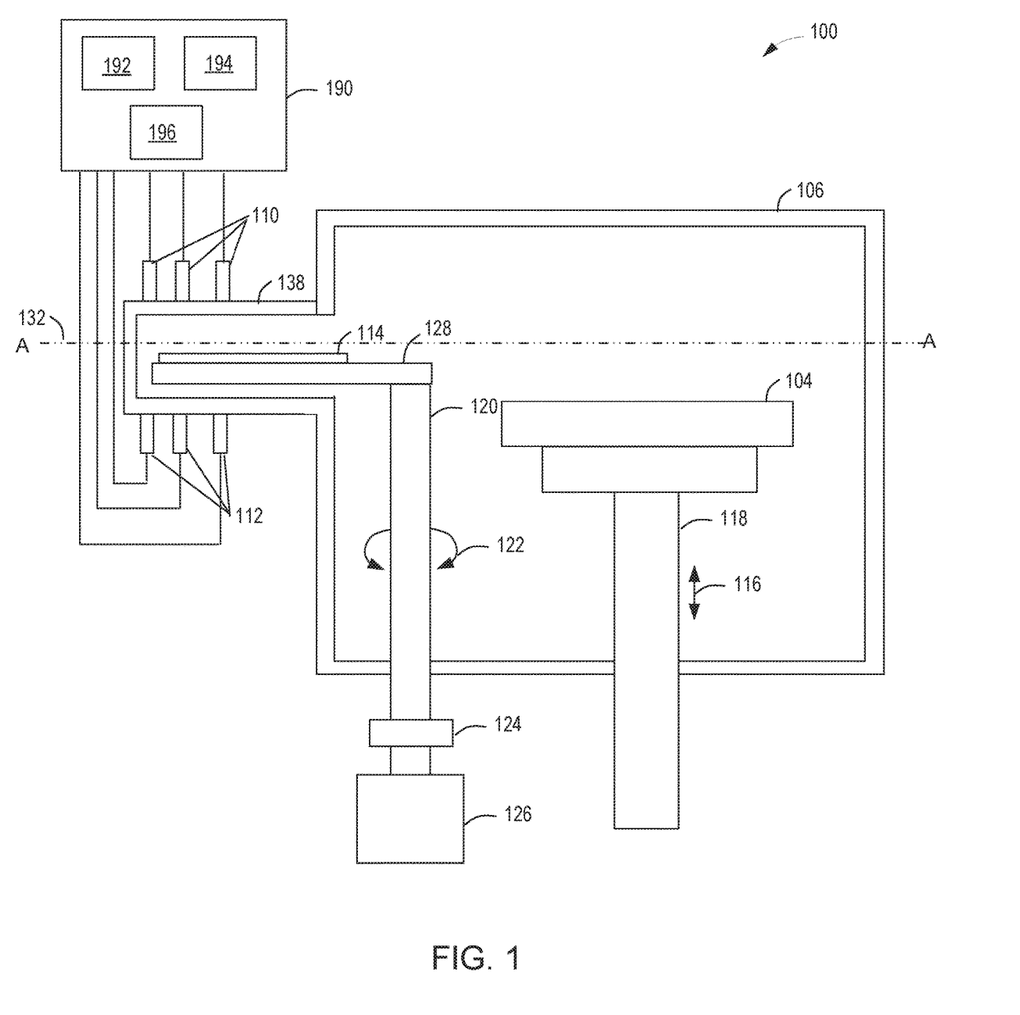
FIG. 1 depicts a process chamber in which apparatus for detecting a shutter disk assembly may be employed or methods of detecting a shutter disk assembly may be performed in accordance with some embodiments of the present principles.

FIG. 1 depicts a process chamber 100 in which apparatus for detecting a shutter disk assembly may be employed or methods of detecting a shutter disk assembly may be performed in accordance with some embodiments. In FIG. 1, a shutter disk assembly may include a shutter disk 114 and a shutter arm 128. In some embodiments, the shutter disk assembly may also include a shaft 120 with a clockwise and counter-clockwise rotation capability (arrow 122), a shaft sensor 124 for detecting a rotational angle of the shutter disk assembly, and/or an actuator 126 for providing rotational force to rotate the shaft 120 to move the shutter arm 128 and/or the shutter disk 114 from a shutter housing 138 to a chamber housing 106 for processing procedures. The shutter disk 114 may be placed on a substrate support 104 to protect the substrate support 104 during processing such as cleaning and/or pasting and the like. The substrate support 104 includes a support shaft 118 which supports the substrate support 104 and also provides electrical connections and/or cooling liquids, etc. The substrate support 104 may move up and down (noted by arrow 116) during processing. If the shutter arm 128, for example, is left over the substrate support 104 when the substrate support 104 is being moved upward, the substrate support 104 may be damaged along with the shutter disk assembly.

To ensure that damage does not occur, sensors are positioned on the shutter housing 138 to allow detection of the position of the shutter disk assembly. In some embodiments, the sensors may include optical sensors that include sensor transmitters 110 paired with sensor receivers 112. In some embodiments, the sensors may use laser or other reflective technologies such that a transmitter and receiver are physically located on a single surface of the shutter housing 138. The sensors provide detection information to a process controller 190. The process controller 190 may include a memory 192, a central processing unit 194, and/or support circuits 196. The process controller 190 oversees processes within the process chamber 100.

The process chamber 100 may be utilized alone or as a processing module of an integrated semiconductor substrate processing system, or cluster tool, such as an ENDURA® integrated semiconductor substrate processing system, available from Applied Materials, Inc. of Santa Clara, Calif. The process chamber 100 may be a pre-clean chamber or a PVD chamber such as the CHARGER™ Under Bump Metallization (UBM) PVD chamber also available from Applied Materials, Inc. Other process chambers and/or cluster tools may suitably be used as well.

Figure 2:
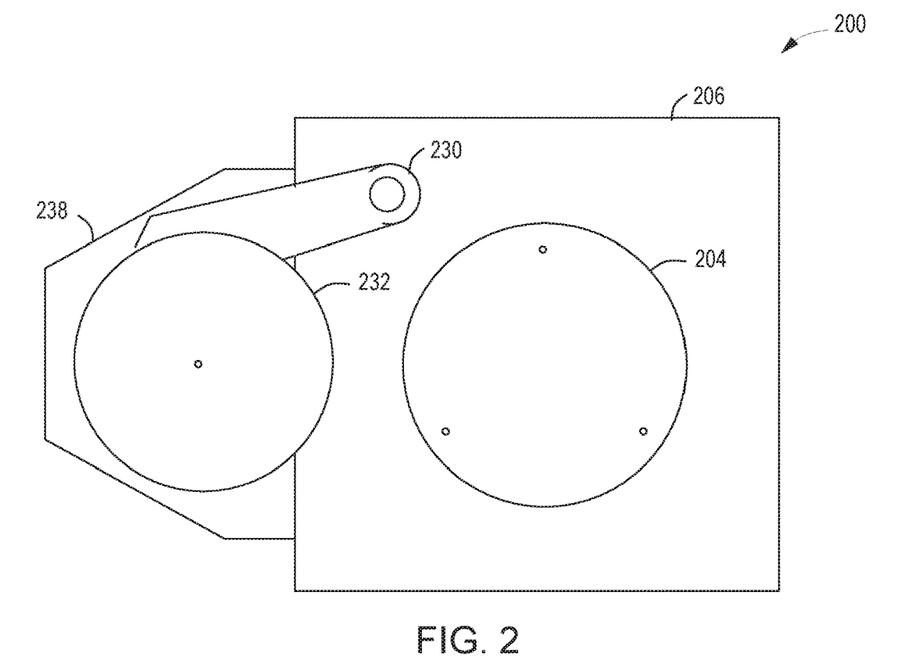
FIG. 2 depicts a cross-sectional view of the process chamber of FIG. 1 in accordance with some embodiments of the present principles.

FIG. 2 depicts a cross-sectional view 200 along the A-A line 132 of the process chamber 100 of FIG. 1 in accordance with some embodiments. Although depicted in a left side orientation, the shutter housing 238 may be located on a right side or back of a chamber housing 206. A shutter disk 232 is resting on a shutter arm 230 and stored in the shutter housing 238. In various processes, the shutter arm 230 may place the shutter disk 232 onto a substrate support 204. Because the shutter arm 230 moves back and forth, the rotational movement may cause the shutter arm 230 to become misaligned or out of calibration. The shutter disk 232 is placed on and removed from the substrate support 204 by the shutter arm 230 and may become misaligned on the shutter arm 230, for example, when removed.

In some embodiments, a detection scheme may be used such as the detection scheme shown in TABLE 1—SHUTTER ARM & DISK DETECTION below. Other detection schemes may be used as well. The detection scheme in TABLE 1 is not meant to be limiting in any manner. In TABLE 1, seven different conditions are detected using three sensors (S1, S2, S3). In some embodiments, more than three sensors may be used. In some embodiments, more or less than seven conditions may be detected. The status column uses a "GOOD/BAD" nomenclature to represent "no fault/no error" (GOOD) or "fault/error" (BAD). An "X" indicates at least some degree of blockage and an "O" indicates no blockage. In some embodiments, a process controller may use the sensor detection information provided by the sensors along with process information to determine the condition of the shutter disk assembly (shutter disk/shutter arm). The process controller may then determine a response based on the determination. The responses may include, but are not limited to, continuing on with the present process (fault free/error free conditions), setting a fault, halting a process, notifying an operator/user, attempting to reposition the shutter disk assembly, and/or running a calibration routine and the like. Some conditions may allow an automated attempt to rectify the fault/error before notifying the operator and/or notifying the operator that the process controller is automatically attempting to rectify the fault.

TABLE 1

SHUTTER ARM & DISK DETECTION

| | | STATUS | S1 | S2 | S3 | CONDITION | RESPONSE |
|---|---|---|---|---|---|---|---|
| 1 | ARM IN HOUSING | GOOD | X | O | O | ARM STORED OK | OK TO CONTINUE |
| 2 | ARM IN HOUSING | BAD | X | X | O/X | ARM MISALIGNED | FAULT, REPOSITION ARM, CALIBRATE, NOTIFY |
| 3 | DISK/ARM IN HOUSING | GOOD | X | O | X | ARM STORED OK; DISK STORED OK | OK TO CONTINUE |
| 4 | DISK/ARM IN HOUSING | BAD | X | X | O | ARM STORED OK; DISK MISALIGNED | FAULT, NOTIFY USER |
| 5 | DISK/ARM IN HOUSING | BAD | O | X | O | ARM MISALIGNED; DISK MISALIGNED | FAULT, NOTIFY USER |
| 6 | DISK/ARM IN HOUSING | BAD | X | X | O | ARM STORED OK; DISK MISALIGNED | FAULT, NOTIFY USER |
| 7 | IDLE | BAD | O | O | O | ARM NOT STORED; DISK NOT STORED | FAULT, NOTIFY USER |

Referencing the above table, the first state of the sensors gives a fault free status and the process is allowed to continue. In the second state of the sensors, S1 and S2 are showing blockage. The sensor S3 may show blockage or may not show blockage. The second state indicates a misaligned arm which may be correctable without operator interaction. Determination of the second state by the process controller allows the controller to decide if the operator should be notified and/or to attempt to automatically correct the fault through calibration or repositioning of the shutter arm. If the fault does not clear, the process controller can notify the operator by setting, for example, an alarm. The third state is a fault free state and the process is allowed to continue. States 4-6 indicate at least some type of disk misalignment that most likely cannot be automatically corrected. The process controller may set an alarm to notify the operator and halt the process. In the seventh state, the shutter disk assembly is in an idle state (disk/arm are engaged in a transfer process within the process chamber—such as, for example, placing or removing the shutter disk from a substrate support, etc.). Generally, an idle state for a shutter disk assembly also has a time duration threshold that when surpassed will trigger an alarm. The process controller can then notify the operator and halt the process to prevent damage.

In some embodiments, the process controller may use sensor provided detection information, sensor detection information derived detection levels, and/or knowledge of a current process operation to determine if a fault is actually occurring, further reducing false alarms. For example, the process controller can use a shaft sensor on the shutter disk assembly to know that the shaft is rotated towards or away from the substrate support. The rotational state of the shaft may help to further determine if a fault has occurred when viewed in light of the detection information from the sensors. Similarly, if the process information indicates heating or cooling is occurring in the process chamber, the expansion and/or contraction of the shutter disk assembly may be taken into account.

FIGS. 3-6 below illustrate some of the shutter disk assembly positions that may cause the conditions shown in TABLE 1. The illustrations are not meant to be limiting.

Figure 3:
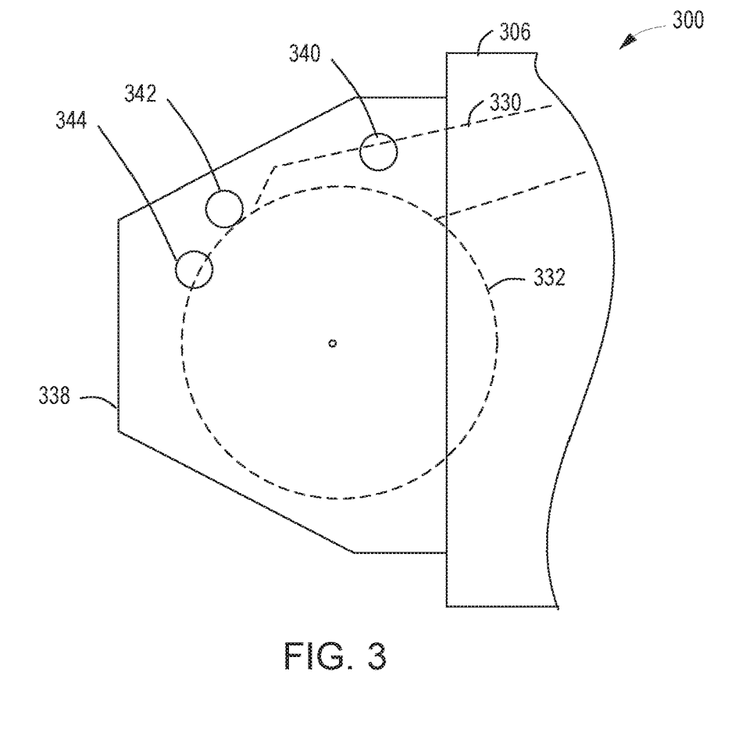
FIG. 3 depicts an apparatus for detecting a correctly stored shutter disk assembly in accordance with some embodiments of the present principles.

FIG. 3 depicts an apparatus 300 for detecting a correctly stored shutter disk assembly in accordance with some embodiments. A first sensor 340 is positioned on a shutter housing 338 to detect proper placement of a shutter arm 330 when stored. The first sensor 340 provides first sensor detection information that indicates a degree of blockage caused by the shutter arm 330.

Sensors may provide a voltage or current signal as sensor detection information to help the process controller to determine when a blockage occurs. In some sensors, the sensor detection information may be a signal level (e.g., in millivolts or milliamps, etc.) that provides some indication of a degree of blockage (weak vs strong signal). Other sensor detection information may include providing an ON/OFF status. Still other sensor detection information may include digital data or a combination of digital and analog data. The process controller may then have the flexibility to determine if the signal is strong enough to be considered 'blocked' or not.

In some embodiments, the process controller may store the determinations in memory as sensor detection levels for later comparisons. The interpretation by the process controller also allows the system to be tuned to further eliminate false alarms for individual process chambers and/or for individual processes or process subroutines.

A second sensor 342 is positioned on the shutter housing 338 to detect when a shutter disk 332 is misaligned on the shutter arm 330 or when the shutter disk assembly is in an overrun condition. The second sensor 342 provides second sensor detection information that indicates a degree of blockage caused by the shutter disk 332. A third sensor 344 is positioned on the shutter housing 338 to detect when a shutter disk 332 is properly stored. The third sensor 344 provides third sensor detection information that indicates a degree of blockage caused by the shutter disk 332. The first sensor detection information, second sensor detection information, and third sensor detection information are sent to a process controller to determine an operational status of the shutter disk assembly. The process controller interprets the first sensor detection information, second sensor detection information, and third sensor detection information to facilitate in determining the operational status of the shutter disk assembly. In some embodiments, the process controller also uses process information and/or sensor detection levels determined during calibration (see below) to aid in determining the operation status. The process information may include information regarding whether the shutter disk assembly should be in a stored position, whether the shutter disk should be in a stored position, or on substrate support position in a process chamber, etc. The shutter housing 338 may be appended to a side of a chamber housing 306 or to a back of the chamber housing 306.

Sensors such as, for example, SUNX brand EX-10 series photoelectric sensors and similar may be used as the first, second, and third sensors. The sensors may be a transmitter and receiver pair. Sensors that report varying signal levels may also be used to add greater granularity and flexibility. Varying signal levels advantageously allows the sensor detection to be tunable by the process controller in that a minimum signal level or threshold from the sensor may be adjusted before a detection is declared. The adjustable threshold allows the process controller flexibility to determine when a blocked status has been achieved. For example, in some embodiments, a 10% or greater blockage of a sensor may be interpreted as "blocked" by the process controller. In some embodiments, a 15% or greater blockage of a sensor may be interpreted as "blocked" by the process controller. The tuning of the sensor signal level by the process controller allows for flexibility in adjusting the detection logic to further eliminate false alarms caused by heat expansion/contraction of the shutter disk assembly and/or depositions on the shutter disk assembly and the like. Mechanical adjustments of the placement may also be utilized in some embodiments to further tune the logic to prevent false alarms.

The placement and/or alignment of the detection holes or windows may also be advantageously varied based on the motion of the shutter arm (e.g., rotation angle and extent of rotation), the size of the shutter disk, and/or elimination of false alarms due to processing effects such as expansion due to heating and/or deposition of material on the shutter disk assembly. In some embodiments, the location of the sensors within the detection holes may also be used to tune and/or calibrate the shutter disk assembly. The sensors may be mounted to allow adjustments of the sensors within the detection holes. The adjustment may be accomplished by slots within the mounting tabs of the sensors and the like to allow movement of the sensors within the detection holes. The adjustment, for example, may include moving the sensor from directly in the center of the detection hole towards the periphery of the detection hole and the like.

Figure 4:
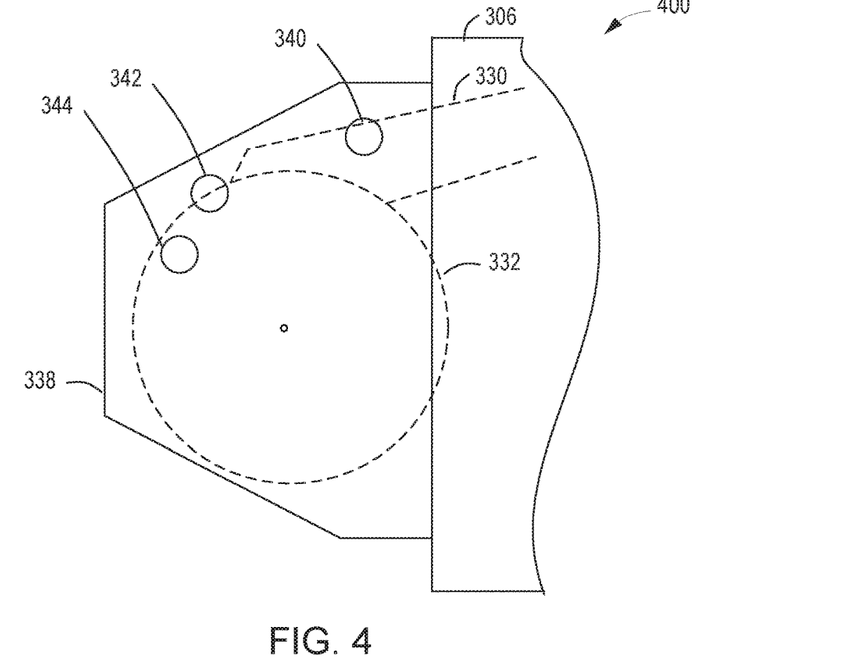
FIG. 4 depicts an apparatus for detecting an incorrectly stored shutter disk assembly in accordance with some embodiments of the present principles.

FIG. 4 depicts an apparatus 400 for detecting an incorrectly stored shutter disk assembly in accordance with some embodiments. The shutter disk assembly is in an overrun condition. The shutter arm 330 and the shutter disk 332 are positioned too far into the shutter housing 338. The first sensor 340 provides first sensor detection information indicating a high degree of blockage from the shutter arm 330. The second sensor 342 provides second sensor detection information with an indication of some degree of blockage by the shutter disk 332. The third sensor 344 provides third sensor detection information indicating a high degree of blockage by the shutter disk 332. The first sensor detection information, second sensor detection information, and third sensor detection information are sent to a process controller to determine an operational status of the shutter disk assembly. A process controller uses the first sensor detection information, second sensor detection information, and third sensor detection information to facilitate, at least in part, in determining the operational status of the shutter disk assembly. In some embodiments, the process controller may also use process information and/or sensor detection levels determined during calibration (see FIG. 8 below) to make a determination.

Figure 5:
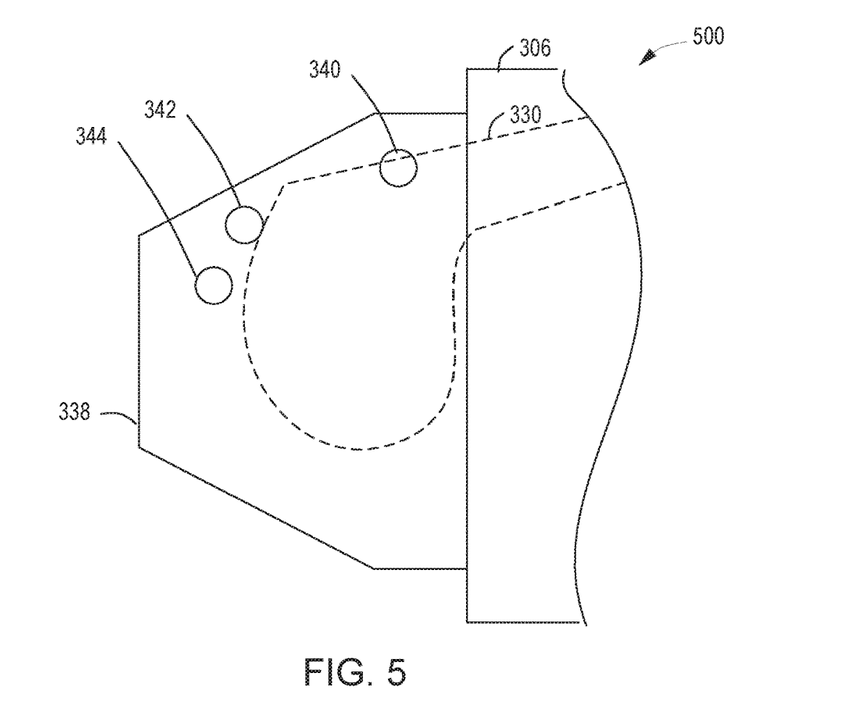
FIG. 5 depicts an apparatus for detecting a correctly stored shutter arm in accordance with some embodiments of the present principles.

FIG. 5 depicts an apparatus 500 for detecting a correctly stored shutter arm 330 in accordance with some embodiments. During some processes, a shutter disk (not shown in FIG. 5) may be left on a substrate support while the shutter arm 330 is stored in the shutter housing 338. The first sensor 340 provides first sensor detection information indicating a high degree of blockage. The second sensor 342 provides second sensor detection information indicating a low or zero degree of blockage. The third sensor 344 provides third sensor detection information indicating a zero degree of blockage. The first sensor detection information, second sensor detection information, and third sensor detection information are sent to a process controller to determine an operational status of the shutter disk assembly. A process controller uses the first sensor detection information, second sensor detection information, and third sensor detection information to facilitate, at least in part, in determining the operational status of the shutter disk assembly. In some embodiments, the process controller may also use process information and/or sensor detection levels determined during calibration (see FIG. 8 below) to make a determination.

Figure 6:
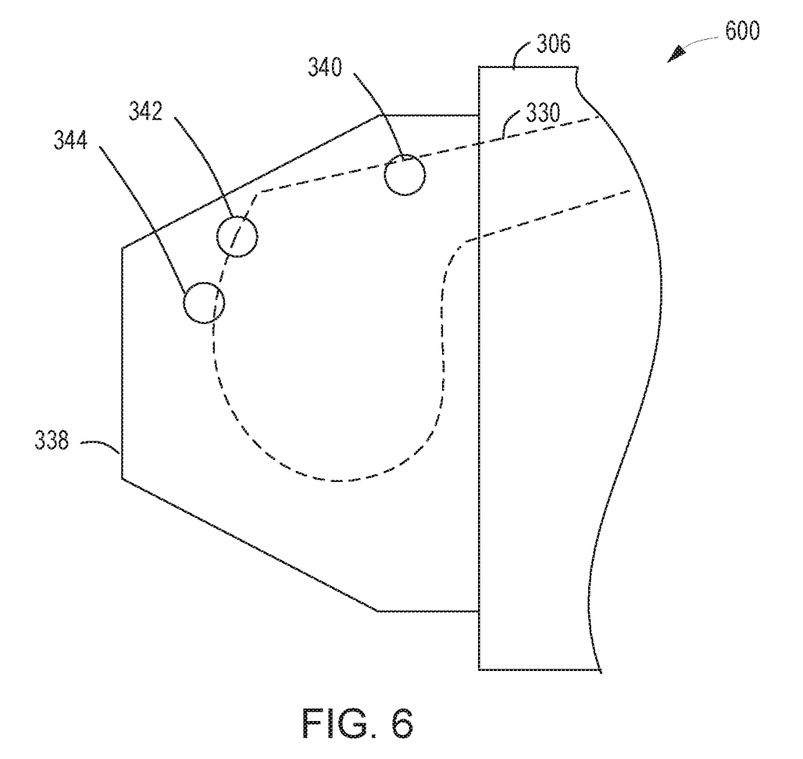
FIG. 6 depicts an apparatus for detecting an incorrectly stored shutter arm in accordance with some embodiments of the present principles.

FIG. 6 depicts an apparatus 600 for detecting an incorrectly stored shutter arm 330 in accordance with some embodiments. In the example, the shutter arm 330 is in an overrun condition. The first sensor 340 provides first sensor detection information indicating a high degree of blockage. The second sensor 342 provides second sensor detection information indicating a high degree of blockage. The third sensor 344 provides third sensor detection information indicating a zero (not shown in FIG. 6) or a low degree of blockage. The first sensor detection information, second sensor detection information, and third sensor detection information are sent to a process controller to determine an operational status of the shutter disk assembly. A process controller uses the first sensor detection information, second sensor detection information, and third sensor detection information to facilitate, at least in part, in determining the operational status of the shutter disk assembly. In some embodiments, the process controller may also use process information and/or sensor detection levels determined during calibration (see FIG. 8 below) to make a determination.

The shutter disk assembly may also be in an idle state during a process (not illustrated, see TABLE 1 above). When an idle state occurs, the shutter disk assembly may be rotated into the chamber to lift up a shutter disk or placing a shutter disk on a substrate support. During an idle state, the first sensor 340 provides first sensor detection information of a zero degree of blockage, the second sensor 342 provides second sensor detection information of a zero degree of blockage, and the third sensor 344 provides third sensor detection information of a zero degree of blockage (the shutter arm 330 and the shutter disk 332 are not in the shutter housing 338). If the idle state exceeds a time duration for the process operation, the process controller may use the timed out information along with the first sensor detection information, second sensor detection information, and third sensor detection information to determine the operational state of the shutter disk assembly.

Figure 7:
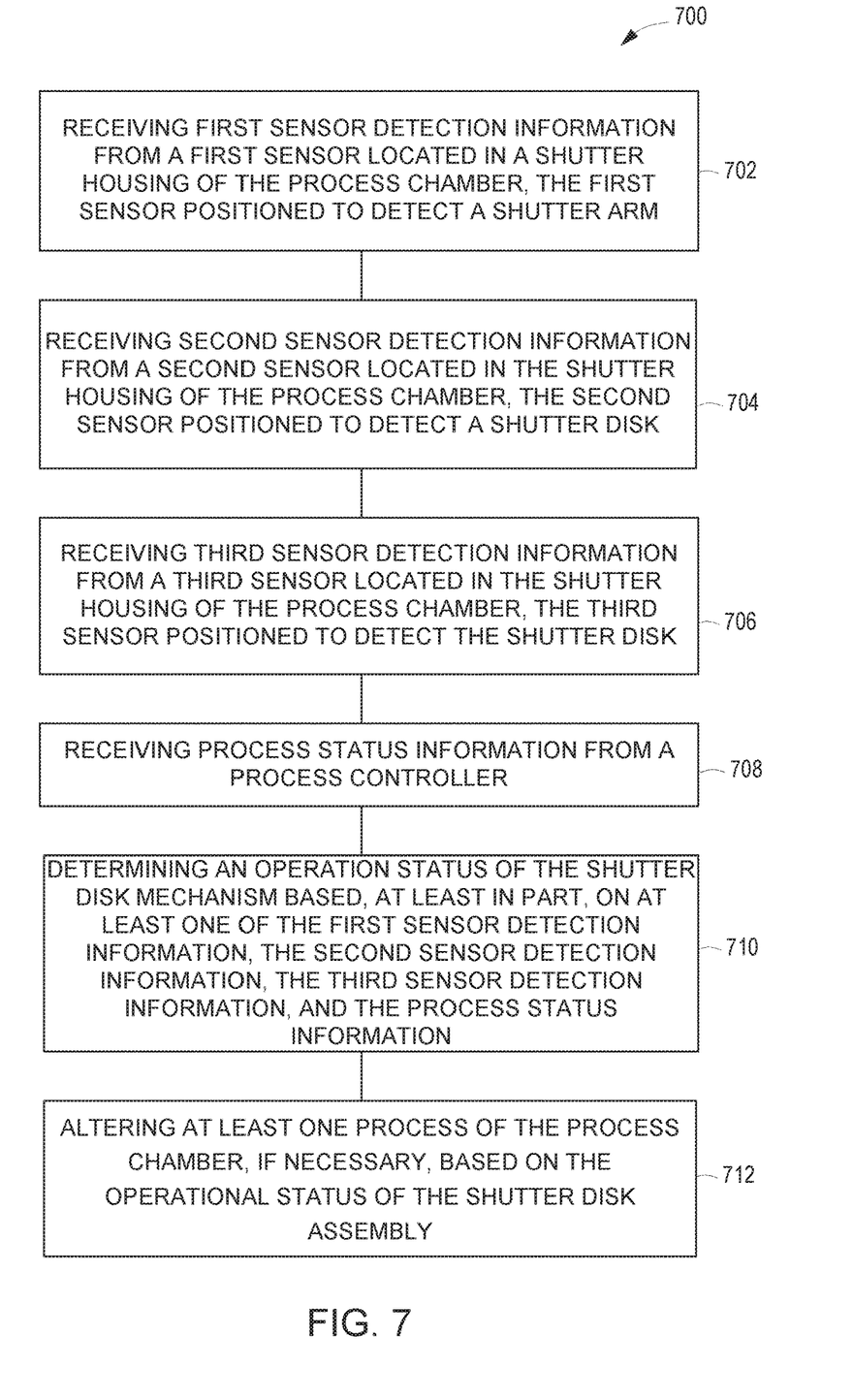
FIG. 7 is a method of detecting a shutter disk assembly in accordance with some embodiments of the present principles.

FIG. 7 is a method 700 of detecting a shutter disk assembly in a process chamber in accordance with some embodiments. In block 702, the method begins by receiving first sensor detection information from a first sensor located in a shutter housing of the process chamber, the first sensor positioned to detect a shutter arm. The first sensor may be placed such that a partial or complete blockage caused by the shutter arm may be detected. In block 704, second sensor detection information from a second sensor located in the shutter housing of the process chamber is received, the second sensor positioned to detect a shutter disk. The second sensor may be placed such that a partial or complete blockage caused by the shutter disk may be detected. In block 706, third sensor detection information from a third sensor located in the shutter housing of the process chamber is received, the third sensor positioned to detect the shutter disk. The third sensor may be placed such that a partial or complete blockage caused by the shutter disk may be detected. In block 708, process information is received from a process controller. The process information may include information regarding whether the shutter disk assembly should be in a stored position, whether the shutter disk should be in a stored position or on substrate support position in a process chamber, whether a shutter disk assembly is transferring or idle, component status such as, for example, angle of rotation of a shutter disk assembly shaft, etc.

In block 710, an operational status of the shutter disk assembly is determined based, at least in part, on at least one of the first sensor detection information, the second sensor detection information, the third sensor detection information, the process information, and/or sensor detection levels determined during calibration (see below). As shown in TABLE 1 above and illustrated in FIGS. 3-6, a combination of information may be used in some embodiments to advantageously reduce false alarms. The allowance of additional information to be used in determining the operational status of the shutter disk assembly also advantageously allows greater flexibility in defining criteria used for the determination. In block 712, at least one process of the process chamber is altered, if necessary, based on the operational status of the shutter disk assembly. The process may be altered, for example, by halting the process, halting the process and setting an alarm, halting the process and running a sub-process to attempt to automatically correct a fault, and/or momentarily halting the process to calibrate or recalibrate and the like. In some embodiments, the operator may be notified aurally and/or visually.

Figure 8:
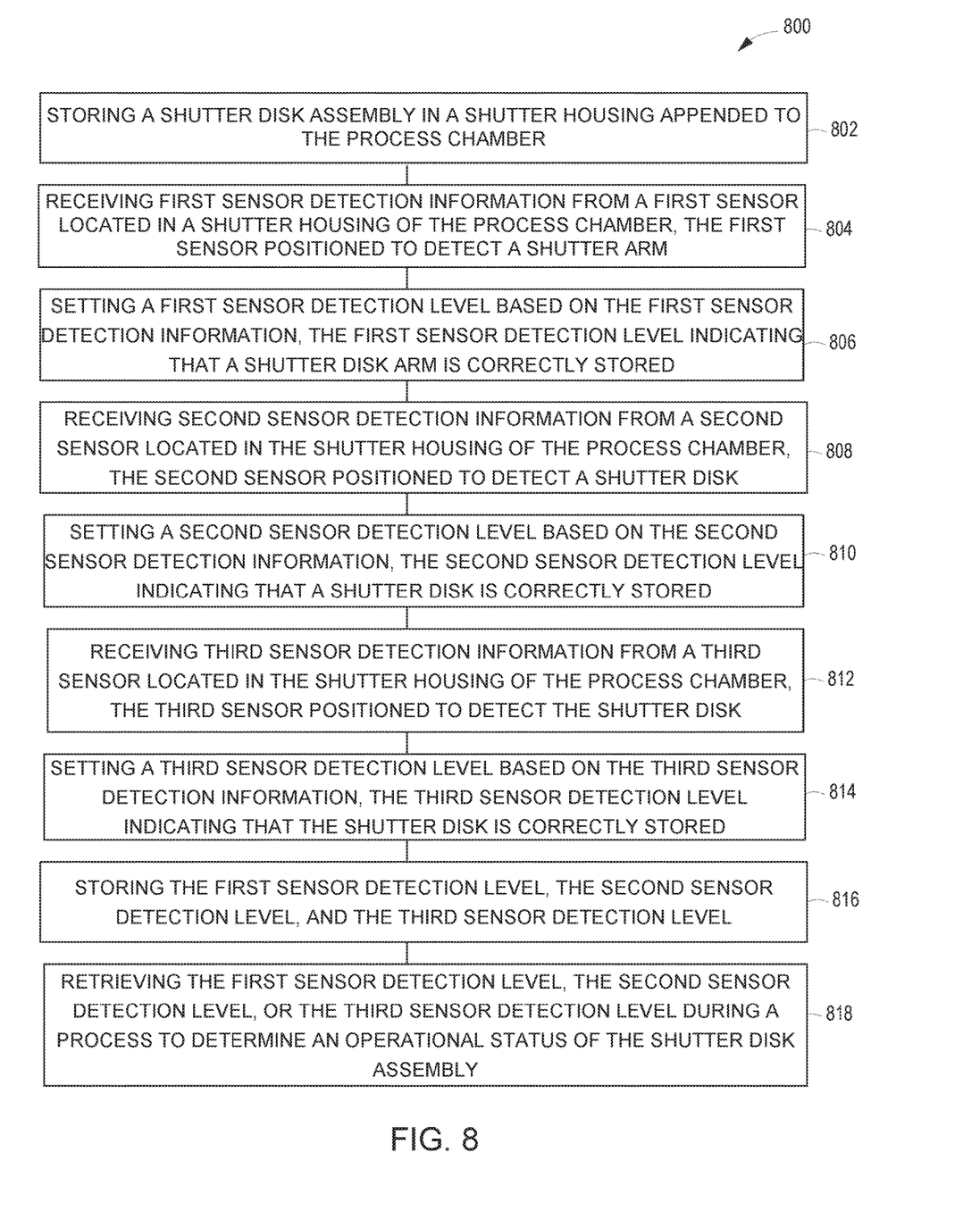
FIG. 8 is a method of calibrating detection of a shutter disk assembly in accordance with some embodiments of the present principles.

FIG. 8 is a method 800 of calibrating detection of a shutter disk assembly in a process chamber in accordance with some embodiments. In block 802, the method begins by storing the shutter disk assembly in a shutter housing appended to the process chamber. The shutter disk assembly should be in a correct position. In block 804, first sensor detection information from a first sensor located in a shutter housing of the process chamber is received, the first sensor positioned to detect a shutter arm. In some embodiments, the sensors may be calibrated individually. The individual calibration advantageously allows for easier troubleshooting by eliminating other variables. In block 806, a first sensor detection level based on the first sensor detection information is set, the first sensor detection level indicating that a shutter disk arm is correctly stored. The first sensor detection information may be a signal level or may be a signal state (e.g., high or low). Some sensors may only provide two states while other sensors may provide a voltage or current level. The value or level of the first sensor detection information may be used by the process controller to know when the shutter arm is in the correct position. The process controller generates the first sensor detection level from the first sensor detection information as a reference to indicate the correct calibrated position. In some embodiments, the first sensor detection information may indicate blockage when the shutter arm is in the correct position.

In block 808, second sensor detection information from a second sensor located in the shutter housing of the process chamber is received, the second sensor positioned to detect a shutter disk. In block 810, a second sensor detection level based on the second sensor detection information is set, the second sensor detection level indicating that a shutter disk is correctly stored. The second sensor detection information may be a signal level or may be a signal state (e.g., high or low). Some sensors may only provide two states or digital data while other sensors may provide an analog data such as a voltage or current level. The value or level of the second sensor detection information may be used by the process controller to know when the shutter disk is in the correct position. The process controller generates the second sensor detection level from the second sensor detection information as a reference to indicate the correct calibrated position. In some embodiments, the second sensor detection information may indicate no blockage when the shutter disk is in the correct position.

In block 812, third sensor detection information from a third sensor located in the shutter housing of the process chamber is received, the third sensor positioned to detect the shutter disk. In block 814, a third sensor detection level based on the third sensor detection information is set, the third sensor detection level indicating that the shutter disk is correctly stored. The third sensor detection information may be a signal level or may be a signal state (e.g., high or low). Some sensors may only provide two states while other sensors may provide a voltage or current level. The value or level of the third sensor detection information may be used by the process controller to know when the shutter disk is in the correct position. The process controller generates the third sensor detection level from the third sensor detection information as a reference to indicate the correct calibrated position. In some embodiments, the third sensor detection level may indicate blockage when the shutter disk is in the correct position.

In block 816, the first sensor detection level, the second sensor detection level, and the third sensor detection level are stored. The process controller may store the first sensor detection level, the second sensor detection level, and the third sensor detection level in memory such as memory 192 of FIG. 1. In some embodiments, the process controller may alter the first sensor detection level, the second sensor detection level, and/or the third sensor detection level on a process by process basis. The alterations of the sensor detection levels before storing in memory may allow the process controller to account for, for example, heat expansion/contraction of the shutter disk assembly and the like during a particular process. The process controller may then retrieve the sensor detection levels stored in memory for a specific process. In some embodiments, the process controller may alter the first sensor detection level, the second sensor detection level, and/or the third sensor detection level to account for deposition of material on the shutter disk assembly during a process before storing the levels in memory. In some embodiments, the process controller may employ an algorithm to determine alterations of the sensor detection levels as a single process runs and/or over multiple runs of the same process. The process controller may then adjust sensor detection levels in or near real-time for process related changes to the shutter disk assembly such as deposition growth on the shutter disk assembly over time and/or over a number of process runs. The process controller may also adjust sensor detection levels in or near real-time for process related changes to the shutter disk assembly such as heat expansion/contraction based on when heat is applied and/or removed.

In block 818, the first sensor detection level, the second sensor detection level, and/or the third sensor detection level is retrieved during a process to determine an operational status of the shutter disk assembly. As described above, the process controller may also use process information in determining the operational status of the shutter disk assembly.

While the foregoing is directed to embodiments of the present principles, other and further embodiments of the principles may be devised without departing from the basic scope thereof.

The invention claimed is:

1. A method of detecting a shutter disk assembly in a process chamber, comprising:
   receiving a first sensor varying signal level that is tunable by a process controller and indicates degrees of sensor blockage from a first sensor located in a shutter housing of the process chamber, the first sensor positioned to detect a shutter arm;
   receiving a second sensor varying signal level that is tunable by the process controller and indicates degrees of sensor blockage from a second sensor located in the shutter housing of the process chamber, the second sensor positioned to detect a shutter disk;
   receiving a third sensor varying signal level that is tunable by the process controller and indicates degrees of sensor blockage from a third sensor located in the shutter housing of the process chamber, the third sensor positioned to detect the shutter disk;
   receiving process information from a process controller;
   determining an operational status of the shutter disk assembly based, at least in part, on at least one of the first sensor varying signal level, the second sensor varying signal level, the third sensor varying signal level, and the process information; and
   altering at least one process of the process chamber, if necessary, based on the operational status of the shutter disk assembly.

2. The method of claim 1, further comprising:
   altering at least one process of the process chamber by performing a calibration of the shutter disk assembly.

3. The method of claim 1, further comprising:
   altering at least one process of the process chamber by re-positioning the shutter arm.

4. The method of claim 1, further comprising:
   altering at least one process of the process chamber by halting the process and setting an alarm.

5. The method of claim 1, wherein the operational status of the shutter disk assembly includes, at least, an angle from a shaft sensor of a shaft of the shutter arm.

6. The method of claim 1, further comprising:
determining if the shutter disk assembly exceeds a time duration threshold during an idle period; and
altering at least one process of the process chamber by halting the process and setting an alarm.

7. The method of claim 1, further comprising:
determining the operational status to not be in error when the first sensor varying signal level indicates a degree of blockage greater than zero, the second sensor varying signal level indicates a degree of blockage equal to zero, the third sensor varying signal level indicates a degree of blockage greater than zero, and the process information indicates shutter disk assembly stored.

8. The method of claim 1, further comprising:
determining the operational status to be in error when the first sensor varying signal level indicates a degree of blockage greater than zero, the second sensor varying signal level indicates a degree of blockage greater than zero, the third sensor varying signal level indicates a degree of blockage equal to zero, and the process information indicates shutter disk assembly stored.

9. The method of claim 1, further comprising:
determining the operational status to be in error when the first sensor varying signal level indicates a degree of blockage equal to zero, the second sensor varying signal level indicates a degree of blockage greater than zero, the third sensor varying signal level indicates a degree of blockage equal to zero, and the process information indicates shutter disk assembly stored.

10. The method of claim 1, further comprising:
determining the operational status to not be in error when the first sensor varying signal level indicates a degree of blockage greater than zero, the second sensor varying signal level indicates a degree of blockage greater than zero, the third sensor varying signal level indicates a degree of blockage equal to zero, and the process information indicates shutter disk assembly stored.

11. The method of claim 1, further comprising:
determining the operational status to be in error when the first sensor varying signal level indicates a degree of blockage greater than zero, the second sensor varying signal level indicates a degree of blockage greater than zero, the third sensor varying signal level indicates a degree of blockage equal to or greater than zero, and the process information indicates shutter arm stored.

12. The method of claim 1, further comprising:
determining the operational status to not be in error when the first sensor varying signal level indicates a degree of blockage greater than zero, the second sensor varying signal level indicates a degree of blockage equal to zero, the third sensor varying signal level indicates a degree of blockage equal to zero, and the process information indicates shutter arm stored.

13. The method of claim 1, further comprising:
determining the operational status to be in error when the first sensor varying signal level indicates a degree of blockage equal to zero, the second sensor varying signal level indicates a degree of blockage equal to zero, the third sensor varying signal level indicates a degree of blockage greater than zero, and the process information indicates shutter disk assembly idle timed out.

14. A method of detecting a shutter disk assembly in a process chamber, comprising:
storing the shutter disk assembly in a shutter housing appended to the process chamber;
receiving a first signal level that is tunable by a process controller and indicates degrees of sensor blockage from a first sensor varying signal from a first sensor located in a shutter housing of the process chamber, the first sensor positioned to detect a shutter arm;
setting, by the process controller, a first sensor detection threshold based on the first signal level, the first sensor detection threshold indicating that a shutter disk arm is correctly stored;
receiving a second signal level that is tunable by the process controller and indicates degrees of sensor blockage from a second sensor varying signal from a second sensor located in the shutter housing of the process chamber, the second sensor positioned to detect a shutter disk;
setting, by the process controller, a second sensor detection threshold based on the second signal level, the second sensor detection threshold indicating that a shutter disk is correctly stored;
receiving a third signal level that is tunable by the process controller and indicates degrees of sensor blockage from a third sensor varying signal from a third sensor located in the shutter housing of the process chamber, the third sensor positioned to detect the shutter disk;
setting, by the process controller, a third sensor detection threshold based on the third signal level, the third sensor detection threshold indicating that the shutter disk is correctly stored;
storing the first sensor detection threshold, the second sensor detection threshold, and the third sensor detection threshold; and
retrieving the first sensor detection threshold, the second sensor detection threshold, or the third sensor detection threshold during a process to determine an operational status of the shutter disk assembly.

15. The method of claim 14, further comprising:
comparing, by the process controller, the first sensor detection threshold, the second sensor detection threshold, or the third sensor detection threshold to current sensor detection information of the first sensor, the second sensor, or the third sensor to determine a status of the shutter disk assembly.

16. The method of claim 14, further comprising:
receiving, by the process controller, process information; and
determining, by the process controller, an operational status of the shutter disk assembly based on current sensor detection information and, at least in part, on at least one of the first sensor detection threshold, the second sensor detection threshold, the third sensor detection threshold, and the process information.

17. A method of detecting a shutter disk assembly in a process chamber, comprising:
storing the shutter disk assembly in a shutter housing appended to the process chamber;
receiving first sensor detection information from a first sensor located in a shutter housing of the process chamber, the first sensor positioned to detect a shutter arm;
setting a first sensor detection level based on the first sensor detection information, the first sensor detection level indicating that a shutter disk arm is correctly stored;

receiving second sensor detection information from a second sensor located in the shutter housing of the process chamber, the second sensor positioned to detect a shutter disk;

setting a second sensor detection level based on the second sensor detection information, the second sensor detection level indicating that a shutter disk is correctly stored;

receiving a third sensor detection information from a third sensor located in the shutter housing of the process chamber, the third sensor positioned to detect the shutter disk;

setting a third sensor detection level based on the third sensor detection information, the third sensor detection level indicating that the shutter disk is correctly stored;

storing the first sensor detection level, the second sensor detection level, and the third sensor detection level;

retrieving the first sensor detection level, the second sensor detection level, or the third sensor detection level during a process to determine an operational status of the shutter disk assembly; and altering the first sensor detection level, the second sensor detection level, or the third sensor detection level to account for heat expansion or contraction of the shutter disk assembly during a process.

18. A method of detecting a shutter disk assembly in a process chamber, comprising:

storing the shutter disk assembly in a shutter housing appended to the process chamber;

receiving first sensor detection information from a first sensor located in a shutter housing of the process chamber, the first sensor positioned to detect a shutter arm;

setting a first sensor detection level based on the first sensor detection information, the first sensor detection level indicating that a shutter disk arm is correctly stored;

receiving second sensor detection information from a second sensor located in the shutter housing of the process chamber, the second sensor positioned to detect a shutter disk;

setting a second sensor detection level based on the second sensor detection information, the second sensor detection level indicating that a shutter disk is correctly stored;

receiving a third sensor detection information from a third sensor located in the shutter housing of the process chamber, the third sensor positioned to detect the shutter disk;

setting a third sensor detection level based on the third sensor detection information, the third sensor detection level indicating that the shutter disk is correctly stored;

storing the first sensor detection level, the second sensor detection level, and the third sensor detection level;

retrieving the first sensor detection level, the second sensor detection level, or the third sensor detection level during a process to determine an operational status of the shutter disk assembly; and altering the first sensor detection level, the second sensor detection level, or the third sensor detection level to account for deposition of material on the shutter disk assembly during a process.

19. An apparatus for detecting a shutter disk assembly for a process chamber, comprising;

a shutter housing appended to the process chamber;

a first sensor attached to the shutter housing such that the first sensor is capable of detecting a shutter arm when the shutter arm is in the shutter housing;

a second sensor attached to the shutter housing such that the second sensor is capable of detecting a shutter disk when the shutter disk is in the shutter housing;

a third sensor attached to the shutter housing such that the third sensor is capable of detecting the shutter disk when the shutter disk is in the shutter housing; and a process controller that interacts with the first sensor, the second sensor, and the third sensor to detect fault conditions of the shutter disk assembly during a process by using a method of detecting the shutter disk assembly in a process chamber, comprising:

receiving a first sensor varying signal level that is tunable by the process controller and indicates degrees of sensor blockage from a first sensor located in a shutter housing of the process chamber, the first sensor positioned to detect a shutter arm;

receiving a second sensor varying signal level that is tunable by the process controller and indicates degrees of sensor blockage from a second sensor located in the shutter housing of the process chamber, the second sensor positioned to detect a shutter disk;

receiving a third sensor varying signal level that is tunable by the process controller and indicates degrees of sensor blockage from a third sensor located in the shutter housing of the process chamber, the third sensor positioned to detect the shutter disk;

receiving process information from a process controller; and determining an operational status of the shutter disk assembly based, at least in part, on at least one of the first sensor varying signal level, the second sensor varying signal level, the third sensor varying signal level, and the process information.

20. The apparatus of claim 19, wherein the process chamber is a pre-clean chamber or a physical vapor deposition (PVD) chamber.

* * * * *